United States Patent
Hsieh et al.

(10) Patent No.: US 6,410,957 B1
(45) Date of Patent: Jun. 25, 2002

(54) METHOD OF FORMING POLY TIP TO IMPROVE ERASING AND PROGRAMMING SPEED IN SPLIT GATE FLASH

(75) Inventors: Chia-Ta Hsieh, Tainan; Di-Son Kuo, Hsinchu; Yai-Fen Lin, Non-Tour; Hung-Cheng Sung, Hsin-Chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/713,840

(22) Filed: Nov. 16, 2000

Related U.S. Application Data (62) Division of application No. 09/354,671, filed on Jul. 16, 1999, now Pat. No. 6,242,308.

(51) Int. Cl.[7] .................. H01L 21/8247; H01L 29/788
(52) U.S. Cl. ................... 257/321; 257/316; 438/594; 438/266
(58) Field of Search ................. 438/266, 593, 438/594; 257/321, 316

(56) References Cited

U.S. PATENT DOCUMENTS

| | | | |
|---|---|---|---|
| 5,173,436 A | 12/1992 | Gill et al. | 437/43 |
| 5,652,161 A | 7/1997 | Ahn | 437/43 |
| 5,858,840 A | 1/1999 | Hsieh et al. | 438/266 |
| 5,872,036 A | * 2/1999 | Sheu | 438/266 |
| 5,879,992 A | 3/1999 | Hsieh et al. | 438/264 |
| 6,090,668 A | * 7/2000 | Lin et al. | 438/266 |

* cited by examiner

Primary Examiner—Richard Booth
(74) Attorney, Agent, or Firm—George O. Saile; Stephen B. Ackerman; Sevgin OKtay (57) ABSTRACT

A method is disclosed for forming a split gate flash memory cell having a thin floating gate and a sharp poly tip in order to improve the erasing and programming speed of the cell. The method involves the use of an oxide other than the poly oxide that is conventionally employed in forming the floating gate, and also using to advantage a so-called "smiling effect" which is normally taught away. The smiling effect, or an uneven thickening of an oxide layer, comes into play while growing interpoly oxide where concurrently the oxidation of the polysilicon gate advances in such a manner so as to form a sharp and reliable poly tip. The invention is also directed to providing a split gate flash memory cell having a thin floating gate and a poly tip therein.

6 Claims, 7 Drawing Sheets

METHOD OF FORMING POLY TIP TO IMPROVE ERASING AND PROGRAMMING SPEED IN SPLIT GATE FLASH

This is a division of U.S. patent application Ser. No. 09/354,671, filing date Jul. 16, 1999 now U.S. Pat. No. 6,242,308, A Method Of Forming Poly Tip To Improve Erasing And Programming Speed In Split Gate Flash, assigned to the same assignee as the present invention.

BACKGROUND OF THE INVENTION (1) Field of the Invention

The present invention relates to split-gate memory cells used in flash EEPROMs (Electrically Erasable Programmable Read Only Memories), and in particular, to a method of forming a poly tip to improve erasing and programming speed of the memory cell.

(2) Description of the Related Art

Erasing and programming speed of a split gate flash memory cell is governed by the capacitive coupling between different parts of the cell. As it will be described more fully later, the programming and erasing of the cell is accomplished by transferring charges between polysilicon or poly parts comprising the floating gate, control gate and the source region in the device substrate. A faster erase speed is achieved if the coupling ratio between the control gate and the floating gate is low, which in turn, is attained by having a thinner floating gate as well as a sharper edge on the gate. With conventional methods of forming split gate cells, it is difficult to have low coupling ratio because of the relatively tall sidewalls of the floating gate. This is compensated to a large extent by forming a sharp edge or tip on the floating gate. On the other hand, higher programming speed is achieved if the coupling ratio between the floating gate and the source region is higher with relatively thicker gate. It is disclosed in the embodiments of the present invention a method of forming a split gate flash memory cell having a thin floating gate and a sharp poly tip in order to improve erasing and programming speed of the cell. The method involves the use of a chemical vapor deposited CVD-top oxide other than the poly oxide that is conventionally employed in forming the floating gate, and also using to advantage a so-called "smiling effect" which is normally taught away.

Conventionally, the floating gate of a split gate memory cell is formed by growing polysilicon oxide, or, polyoxide, on the polysilicon layer that eventually becomes the floating gate while the overlying polyoxide is used as a hard mask to etch the polysilicon gate. However, depending upon the doping, grain size and the oxidation speed of the polysilicon, there is formed around the edges of the polyoxide a protrusion of a particular shape, usually variations on the well known gate bird's beak, into the polysilicon which affects the erase speed of the cell and hence the performance of the memory device. A different technique of forming the oxide over the polysilicon gate is proposed in this invention so that the protrusion in the form of a well defined and sharp poly tip can predictably be formed each time in order to provide a reliable memory cell. The sharpness of the tip improves the erase speed.

The shape and size of different portions of memory cells have different effects on the performance of the memory cells in different ways. Thus, with the well-known one-transistor memory cell, which contains one transistor and one capacitor, many variations of this simple cell have been advanced for the purposes of shrinking the size of the cell and, at the same time, improve its performance. The variations consist of different methods of forming capacitors, with single, double or triple layers of polysilicon, and different materials for the word and bit lines. Another variation which is disclosed in this invention relates to the shape of the edge of the floating gate which significantly affects the erase speed of split-gate flash memory cells.

Memory devices include electrically erasable and electrically programmable read-only memories (EEPROMs) of flash electrically erasable and electrically programmable read-only memories (flash EEPROMS). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Figure 1A:
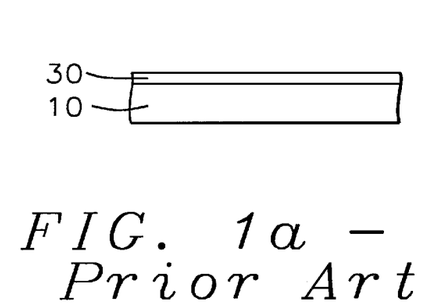
FIGS. 1a–1g are cross-sectional views of a portion of a semiconductor substrate showing the steps of forming a conventional split-gate flash memory cell.
Figure 1B:
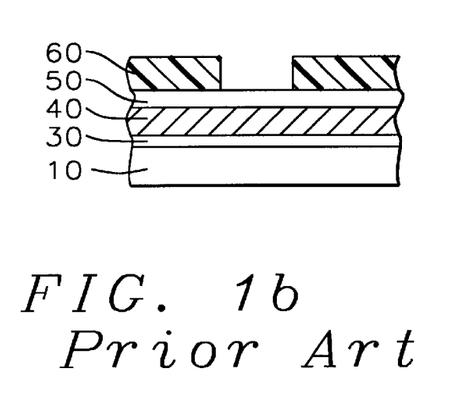
Figure 1C:
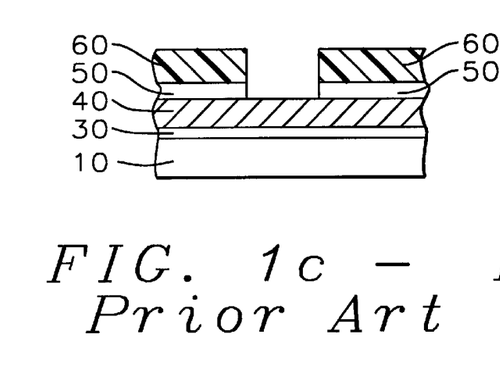
Figure 1D:
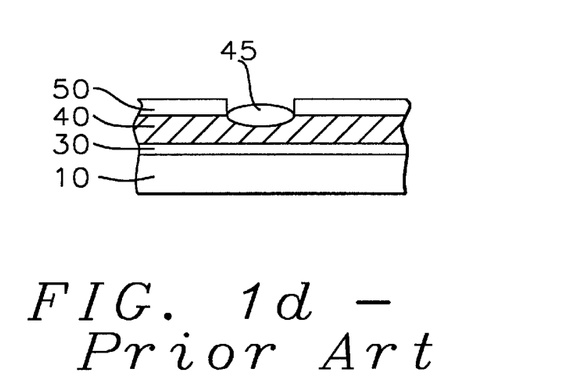
Figure 1E:
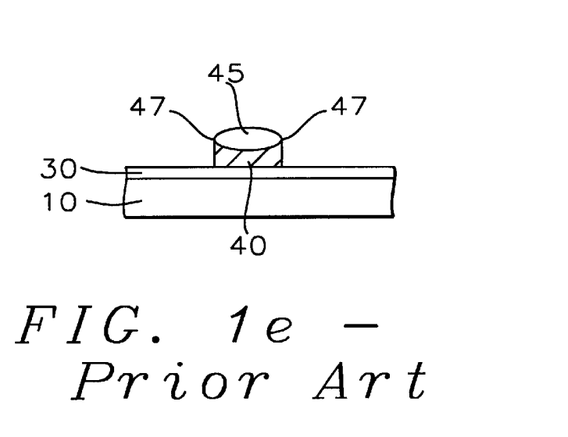
Figure 1F:
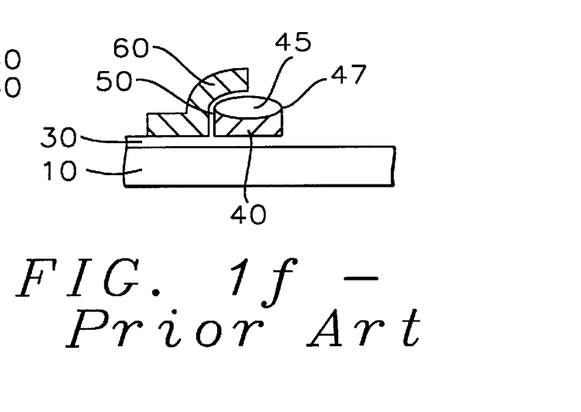
Figure 1G:
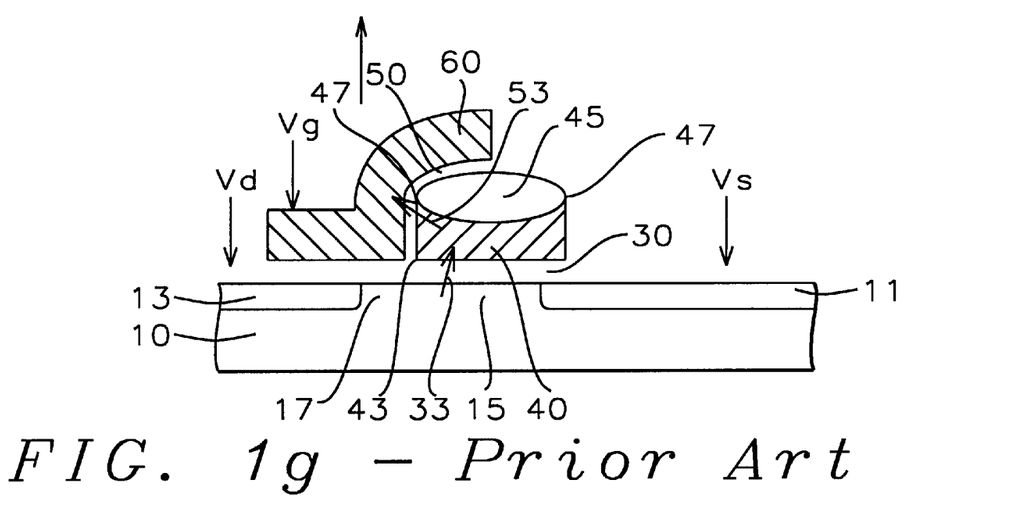

Most conventional flash-EEPROM cells use a double-polysilicon (poly) structure of which the well known split-gate cell is shown in FIG. 1g. The forming of the cell is shown in FIGS. 1a–1f which will be described shortly. In the final form of the cell shown in FIG. 1g, a MOS transistor is formed on a semiconductor substrate (10) having a first doped region (11), a second doped region (13), a channel region (15), a gate oxide (30), a floating gate (40), intergate dielectric layer (50) and control gate (60). Substrate (10) and channel region (15) have a first conductivity type, and the first (11) and second (13) doped regions have a second conductivity type that is opposite the first conductivity type.

As seen in FIG. 1g, the first doped region, (11), lies within the substrate. The second doped region, (13), lies within substrate (10) and is spaced apart form the first doped region (11). Channel region (15) lies within substrate (10) and between first (11) and second (13) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

In the structure shown in FIG. 1g, control gate (60) overlaps the channel region, (17), adjacent to channel (15) under the floating gate, (40). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (17) determines the cell performance. Furthermore, the shape of the edge (43) and, in particular, that of edge (47) can affect the programming of the cell. It is disclosed in this invention that the shape and size of edge (47) will affect the programming erase speed of the cell substantially. The relatively rounded shape that is found in conventional cells shown in FIG. 1g and which affects the erase speed adversely is the result of the commonly used process which is illustrated in FIGS. 1a–1e.

Figure 1H:
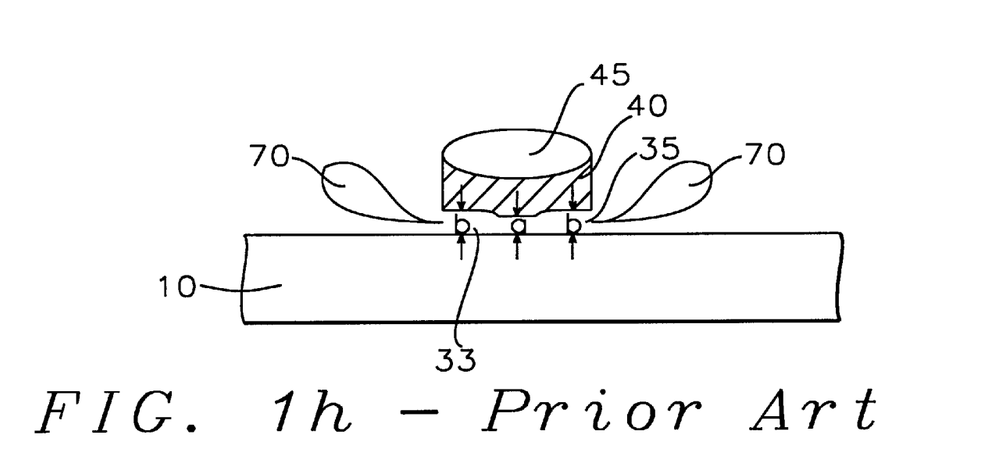
FIG. 1h is an enlarged view of the forming of a conventional "smiling effect" structure at the edge of the floating gate of FIG. 1g.

The same conventional process depicted in FIGS. 1a–1f also lends to the "smiling effect" shown in FIG. 1h, which also degrades the programmability of the memory cell. Floating gate (40), including the overlying polyoxide layer (45), and the "smiling" structure are shown in FIG. 1h. "Smiling" effect refers to the thickening of the edges (35), or "lips" of the gate oxide underlying the polysilicon floating gate of a memory cell caused—as will be apparent to those skilled in the art—by the diffusion of oxygen (70) during the forming of the polyoxide (45) over the gate as shown in FIG. 1h. That is, during oxidation, oxygen (70) diffuses into the gate (40) as well as into gate oxide (30) through its edges (35) and grows the edges as shown in FIG. 1h. Hence the thickness (b) at edge (35) becomes larger than its original thickness (a), thereby resulting in a structure having a "smiling" effect.

Now referring to a conventional method of forming a split gate flash memory cell, a layer of gate oxide (30) is thermally grown over substrate (10) as shown in FIG. 1a. Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The photoresist layer, which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are covered by the polyoxide (FIG. 1e). As is well known in the art, this is usually accomplished by main etch followed by over-etch. It is at this etching step that the corner edge (47) is usually rounded off, as seen in FIG. 1e, which is not desirable for achieving fast program erase speed described below. It will be shown later in the embodiments of this invention that by employing a different process step, the sharpness of corner edge (47) can be preserved such that charge transfer (33) between substrate (10) and floating gate (40), and then the charge transfer (53) between the floating gate and control gate, (60), is fast. The control gate is formed by depositing a second polysilicon layer over intergate layer (50), also known as interpoly, which separates the two polysilicon layers, namely, the floating polygate and the control polygate.

To program the transistor shown in FIG. 1g, which is an enlarged view of FIG. 1f as well as showing the placement of gate, source and drain voltages or $V_g$, $V_s$, and $V_d$, respectively, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (11) and drain (13), and to control gate (60), and then sensing the amount of charge on floating gate (40). To erase the contents of the cell, the programming process is reversed, namely, charges are removed from the floating gate by transferring them to the control gate. Thus, programming and erasing of an EEPROM is accomplished electrically and in-circuit by hot-electron channeling and Fowler-Nordheim tunneling, respectively, as is well known in prior art. Of importance in the tunneling region is the quality and the thinness of the tunneling oxide separating the floating gate from the substrate. At the same time, it is the sharp profile of the poly tip that controls the erasing and programming speed of a split-gate flash memory cell. It is disclosed later in the embodiments of the present invention that such a sharp poly tip can be obtained in a more controllable manner by employing a thin poly for the floating gate.

In prior art, it is difficult to control the shape of a poly tip because it is solely dependent upon how the polyoxide overlying the floating gate is formed during the oxidation of the poly. For example, Hsieh, et al., in U.S. Pat. No. 5,879,992 rely on the polyoxide in fabricating a step poly to improve program speed in split-gate flash. Polyoxide is formed over portions of a first polysilicon layer which in turn is partially etched to form a step adjacent to the side-wall of a floating gate underlying the polyoxide. A spacer is next formed of a hot temperature oxide over the step poly. An interpoly oxynitride is then formed and control gate is patterned overlapping the floating gate with the intervening interpoly oxide. The step poly and the spacer thereon form proper distances between the control gate and the floating gate while keeping the distance between the poly tip and the control gate unchanged so that appropriate couplings between the control gate and the floating ate, and between the floating gate and the substrate are achieved, thus improving the over-all performance of the split-gate flash memory having a step poly.

In another U.S. Pat. No. 5,858,840, Hsieh, et al., disclose a method of forming sharp peak of poly by nitrogen implant to improve erase speed for split-gate flash. This is accomplished by implanting nitrogen ions in the first polysilicon layer of the cell and removing them from the area where the floating gate is to be formed. Then, Hsieh, et al., oxidize the polysilicon layer to form polyoxide. The floating gate region without the nitrogen ions oxidizes faster than the surrounding area still having the nitrogen ions. Consequently, the bird's beak like poly tip that is formed at the edges of the polyoxide assumes a sharper shape with smaller size than usually found. This results in an increase in the erase speed of the memory cell.

Gill, et al., on the other hand, propose a different method of manufacturing an EEPROM with trench-isolated bitlines. The bitlines and source/drain regions are buried beneath relatively thick silicon oxide and the floating gate extends over the thick silicon oxide. Programming and erasing are accomplished by causing electrons to tunnel through the oxide in the tunnel window. The tunnel window has a thinner dielectric than the remainder of the oxides under the floating gate to allow Fowler-Nordheim tunneling. Trenches and ditches are used for electrical isolation between individual memory cells, allowing an increase in cell density. Ahn of U.S. Pat. No. 5,652,161 shows another method of making split gate flash cell where the degradation of the tunnel oxide film of the cell due to the band-to-band tunneling and the secondary hot carrier which are generated by a high electric field at the overlap region between the junction region and the gate electrode is prevented.

It will be apparent to those skilled in the art that improved methods of controlling the forming of the poly tip are needed. Traditional methods of forming poly tip rely on the poly oxidation process. However, the sharpness of the poly tip is not easy to control due to tighter process window for floating gate poly etching. Furthermore, conventional thick poly floating gates have relatively high side-walls which contribute to lower coupling ratio between the wordline and the floating gate of a cell. It is disclosed below a method of forming a poly tip with a thin polysilicon floating gate, and with a top-CVD oxide in place of poly-oxide. Also, unlike in prior art, the method of forming spacers is reversed so as to protect the poly tip from damage while at the same time providing an interpoly oxide with unvarying thickness. It will be appreciated that the interpoly thickness variation contributes to the variation in the erasing speed of the cell.

The present invention discloses another approach to forming a split gate flash memory cell having a thin poly gate and a sharp poly tip where "smiling effect" is used to advantage, thereby improving the programmability and erasing of the cell.

SUMMARY OF THE INVENTION

It is therefore an object of this invention to provide method of forming a poly tip to improve the erasing and programming speed of a split gate flash memory cell.

It is another object of this invention Lo provide a method of forming a thin floating gate in order to form a sharp poly tip in a split gate flash memory cell.

It is yet another object of this invention to provide a method of employing "smiling effect" in the forming of a sharp poly tip in a thin floating gate of a split gate flash memory cell.

It is still another object of the present invention is to provide a split gate flash memory cell having a thin floating gate with a sharp poly tip formed with "smiling effect" in order to improve the erasing and programming speed of the memory cell.

These objects are accomplished by providing a silicon substrate having a plurality of active and field regions defined; forming a gate oxide layer over said substrate; forming a first polysilicon layer over said gate oxide layer; forming a top-CVD oxide layer over said first polysilicon layer; forming a photoresist mask over said top-CVD oxide layer to define a floating gate pattern for said memory cell; etching said top-CVD oxide layer, said first polysilicon layer and said gate oxide layer through said photoresist mask to form a floating gate structure; forming an interpoly oxide layer over said substrate including said floating gate structure; forming a poly tip in said first polysilicon layer of said floating gate; forming a second polysilicon layer over said interpoly oxide and patterning said second polysilicon layer to form control gate structure of said split-gate flash memory cell.

These objects are further accomplished by providing a split-gate flash memory cell having a poly tip formed in a thin floating gate and shaped by a "smiling effect" structure formed in the interpoly oxide grown between the flowing gate and the control gate. Furthermore, the flash memory cell utilizes a top-CVD oxide layer in place of the poly-oxide that is conventionally employed.

BRIEF DESCRIPTION OF THE DRAWINGS

FIGS. 3a–3e are cross-sectional views corresponding to the top views of the semiconductor substrate shown in FIGS. 2a–2e.

More specifically,

DESCRIPTION OF THE PREFERRED EMBODIMENTS

Referring now to the drawings, in particular to FIGS. 2a–2e, and 3a–3g there are shown schematically steps of forming a split-gate flash memory cell having a sharp poly tip wherein a thin polysilicon layer forms the floating gate of the cell. It will become more apparent from the figures that it is the combination of the thin polysilicon layer and the forming of an interpoly oxide with a "smiling effect" structure that yields the disclosed poly tip with the desired effect of improving the speed of the cell. Further, it will be appreciated by those skilled in the art that by employing a top-CVD (chemical vapor deposited) oxide layer over the first polysilicon layer in place of the conventional poly-oxide layer, a more reliable and sharper poly tip can be formed.

Figure 2A:
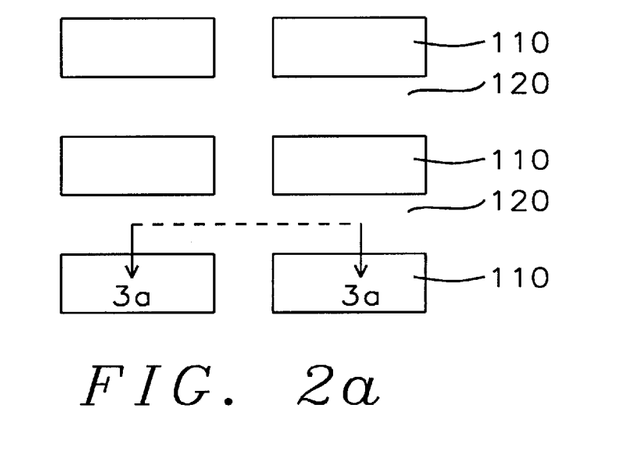
FIGS. 2a–2e are top views of a semiconductor substrate showing the forming of the poly tip of this invention.

FIGS. 2a–2e show the top views of a semiconductor substrate (100), preferably silicon, at different process steps of forming the poly tip of this invention. FIGS. 3a–3g are cross sections corresponding to the substrate of FIGS. 2a–2e. Following methods well known in the art, substrate (100) is provided with passive filed oxide regions (110) separating active device regions (120) as shown in FIG. 2a. A cross-sectional view of an active region is shown in FIG. 3a. As shown in the same Figure, a gate oxide layer, (130), is formed over substrate (100). Gate oxide (130) can be formed by thermal oxidation process at a temperature between about 800° C. to 900° C. Alternatively, the gate oxide can be formed by an atmospheric or low pressure chemical vapor deposition (LPCVD) process as is well known. Gate oxide layer (130) has a thickness between about 70 to 90 angstroms (Å).

As an important step in the present invention, a relatively thin first polysilicon layer (140) is next deposited over the gate oxide layer through reduction of $SiH_4$ using LPCVD at a temperature between about 530 to 650° C. The preferred thickness of the first layer of polysilicon is between about 50 to 200 Å. Conventionally, a relatively thick first polysilicon layer, on the order of about 1000 Å or more, is usually formed and a portion is oxidized to form a hard poly-oxide mask. In the present invention, and as another important step, the conventional poly-oxide layer is replaced with a top-CVD oxide layer by depositing tetraethyl orthosilicate (TEOS) oxide to a thickness between about 400 to 1500 Å. Top-CVD oxide layer (150) is shown in FIG. 3b which is a cross-section taken at (3b)—(3b) shown in FIG. 2b.

Figure 2B:
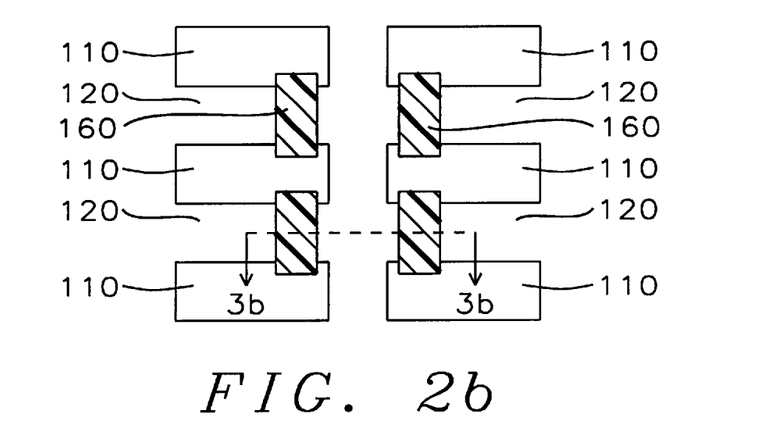
Figure 2C:
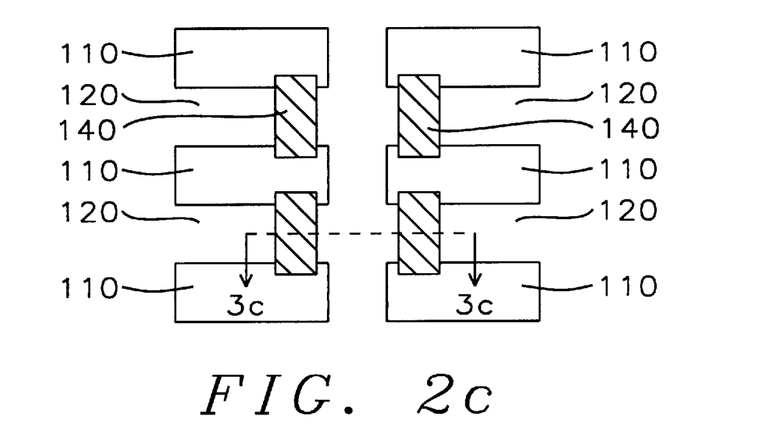
Figure 2D:
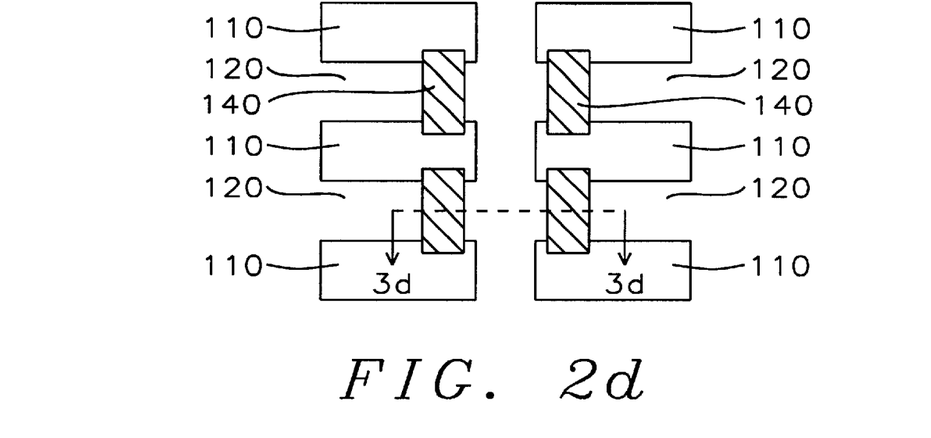
Figure 3A:
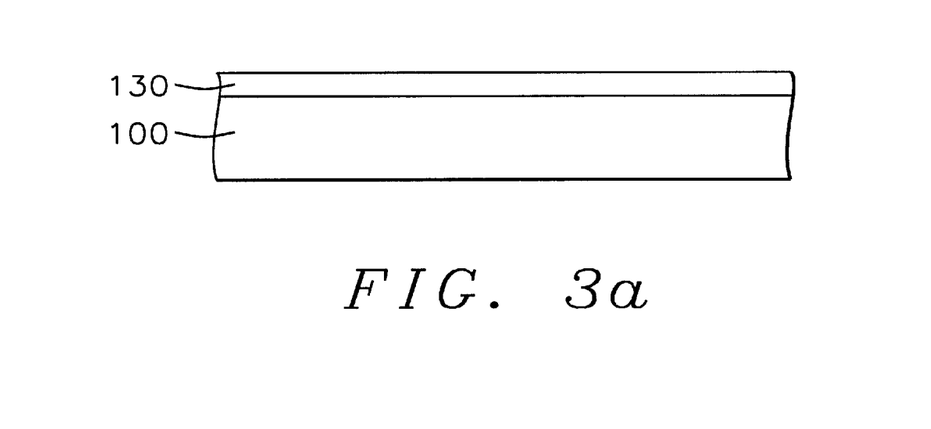
FIG. 3a is a cross-sectional view of a portion of a semiconductor substrate showing the forming of a gate oxide layer, according to this invention.
Figure 3B:
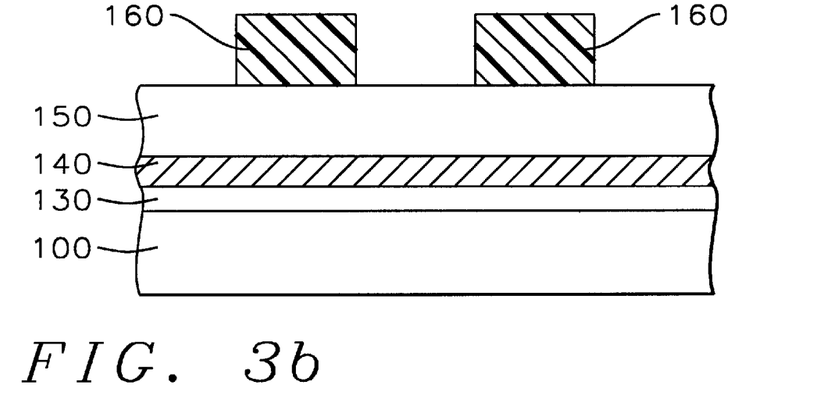
FIG. 3b is a cross-sectional view of a portion of a semiconductor substrate showing the forming of a first polysilicon layer, a top-CVD oxide layer, followed by the forming of a patterned photoresist layer over the gate oxide layer of FIG. 3a, according to this invention.
Figure 3C:
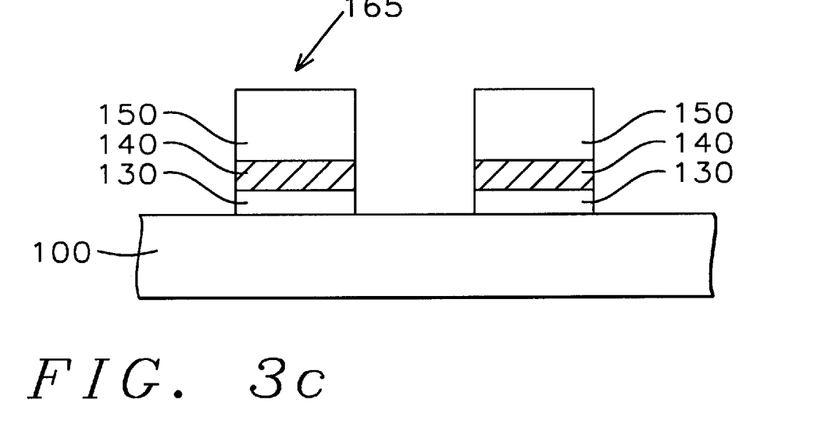
FIG. 3c is a cross-sectional view of a portion of a semiconductor substrate showing the etching of the layers of FIG. 3b and the forming of the floating gate structure, according to this invention.

Next, a first photoresist layer (160) is formed over top-CVD oxide layer (150) to form a photoresist mask having patterns protecting areas where floating gates are to be defined as shown in both FIGS. 2b and 3b. Portions of the underlying layers, namely, top-CVD oxide layer (150), first polysilicon layer (140) and gate oxide layer (130), that are not protected by the photoresist mask are then etched using an etch recipe comprising $CHF_3$, $CF_4$, HBr and $Cl_2$. Thus, floating gate structures (165) shown in FIG. 3c are formed. FIG. 2c shows a top view of the substrate at the first polysilicon, or, floating gate level.

Figure 3D:
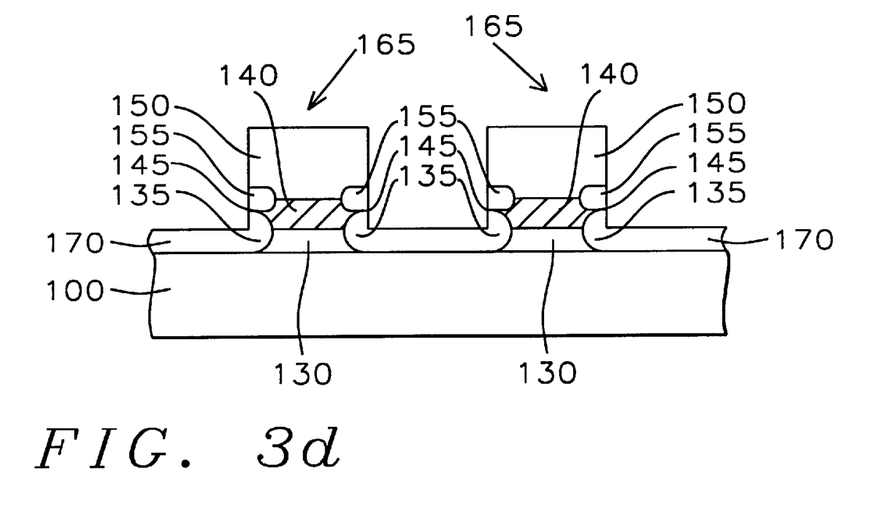
FIG. 3d is a cross-sectional view of a portion of a semiconductor substrate showing the forming of the interpoly oxide as well as the poly tip of this invention having the shape of a wedge formed by the "smiling effect" structure of the interpoly oxide, according to this invention.
Figure 3E:
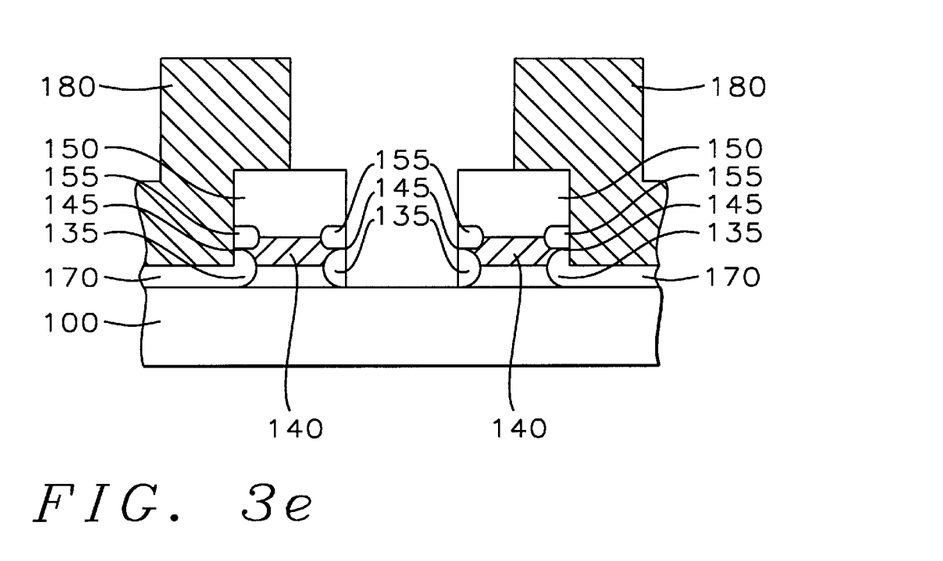
FIG. 3e is a cross-sectional view of a portion of a semiconductor substrate showing the forming of a control gate over the floating gate of FIG. 3d, according to this invention.

At the next step, and as a main feature and key aspect of the present invention, a layer of interpoly oxide (170) is formed over the substrate, including the floating gate structures (165) as shown in FIG. 3d. The interpoly oxide comprises oxynitride and is preferably formed at a temperature between about 800 to 1000° C. It is important to note that during the oxidation forming of the oxynitride, a sharp poly tip profile is shaped into the first polysilicon layer. That is, the thickening of oxide layer (170) at corners (135) shown in FIG. 3d is allowed until sharp tip (145) is formed in the first polysilicon layer of the floating gate. In this manner, the mechanism of "smiling effect" described earlier is used to advantage in forming the desired poly tip (145). It will be noted that at the same time the interpoly or intergate oxide is formed through the oxidation process, the upper edges (155) of the first polysilicon layer are also oxidized to further shape the poly tip into a sharp, wedge form.

Figure 2E:
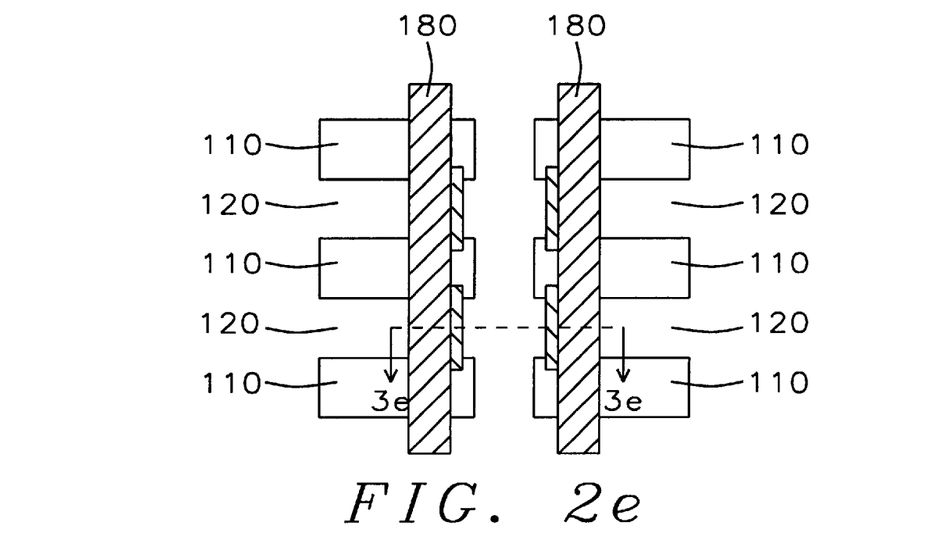

The completion of the split-gate is accomplished by depositing a second polysilicon layer (180) over the substrate as shown in the top view in FIG. 2e. Layer (180) is then patterned to form control gate (180), better seen in the cross-sectional view in FIG. 3e. It is preferred that the second layer of polysilicon is formed using silicon source $SiH_4$ in an LPCVD chamber at a temperature between about 530 to 650° C., and that it has a thickness between about 1000 to 3000 Å.

Figure 3F:
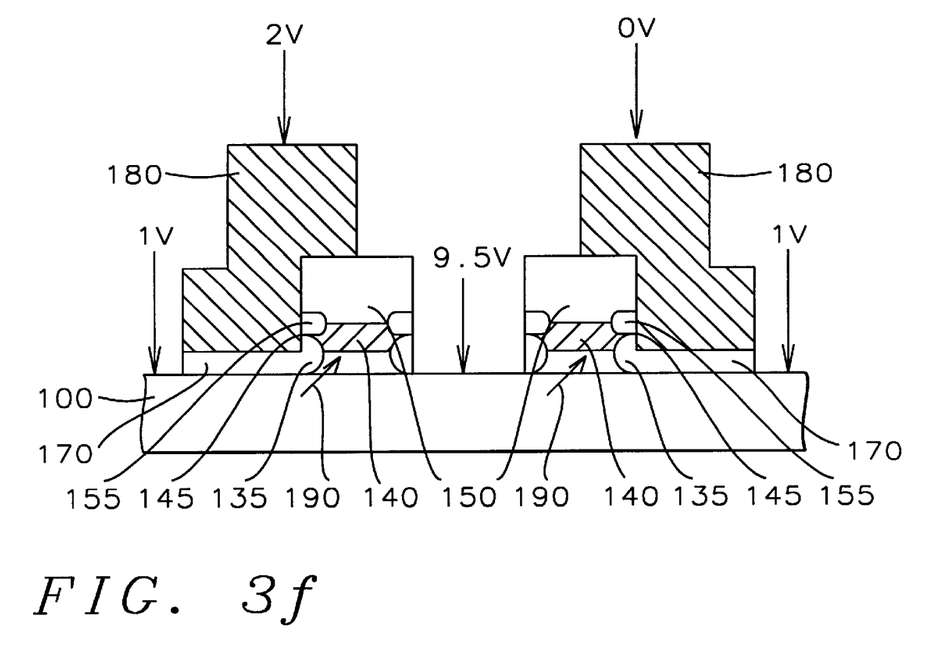
FIG. 3f is a cross-sectional view of a portion of a semiconductor substrate depicting the programming operation of the split-gate flash memory cell of this invention.
Figure 3G:
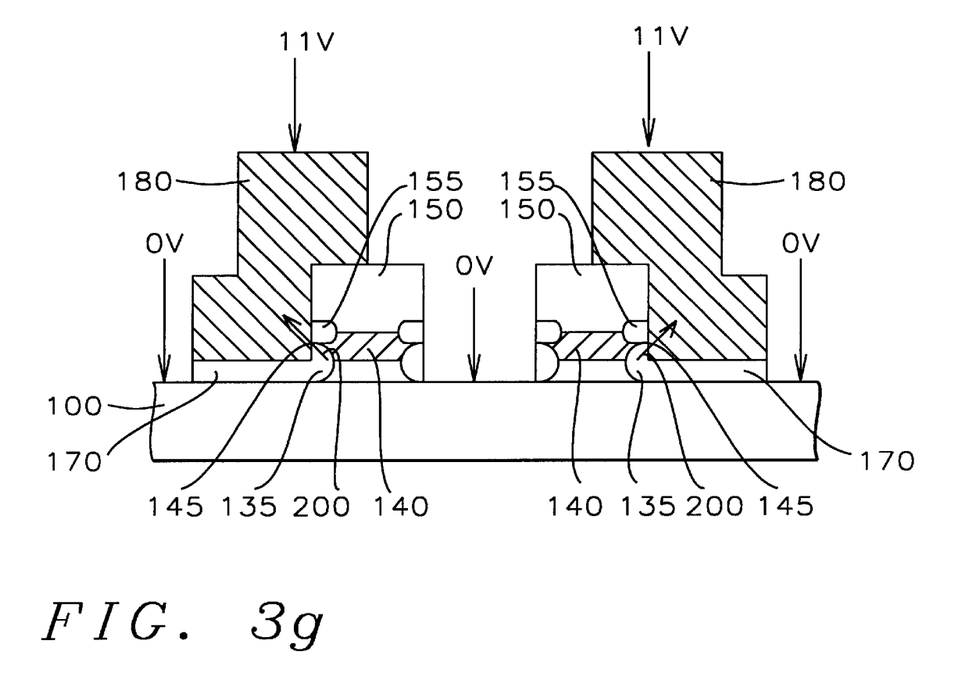
FIG. 3g is a cross-sectional view of a portion of a semiconductor substrate depicting the erasing operation of the split-gate flash memory cell of this invention.

The programming and erasing of the presently disclosed split-gate flash memory cell are shown in the cross-sectional FIGS. 3f and 3g. In FIG. 3f, programming operation of the disclosed split-gate flash memory cell is depicted where the source voltage $V_s$ is set at 9.5 volts, the drain voltage $V_d$ at 1 volt, while the gate voltage $V_g$ is set at 2 volts. Thus, electrons are transferred to the floating gate (140) as shown by the arrow (190) in the same FIG. 3f. For the erasing operation shown in FIG. 3g, on the other hand, the source and drain voltages are set at 0 volts, while the gate voltage at 11 volts. Under this condition, the charge on the floating gate (140) tunnel through the interpoly oxide layer (170) into conlrol gate (180), thus reversing the state of the floating gate of the memory cell. It will be noted that the enhanced sharp peak (145) of floating gate (140) improves coupling between the floating gate and the control gate and hence promoting faster erase operation.

While the invention has been particularly shown and described with reference to the preferred embodiments thereof, it will be understood by those skilled in the art that various changes in form and details may be made without departing from the spirit and scope of the invention.

What is claimed is:

1. A split-gate flash memory cell having a poly tip comprising:
   a substrate having active and field regions defined;
   a thin floating gate having a thickness between about 50 to 200 Å and overlying but separated from said substrate by gate oxide;
   said floating gate having a poly tip of a shape of a wedge formed by a "smiling effect";
   a top-CVD oxide layer disposed over said thin floating gate; and
   a control gate disposed over said floating gate with inter-poly oxide therebetween.

2. The split-gate memory cell of claim 1, wherein said gate oxide layer has a thickness between about 70 to 90 Å.

3. The split-gate memory cell of claim 1, wherein said top-CVD oxide layer has a thickness between about 400 to 1500 Å.

4. The split-gate memory cell of claim 1, wherein said interpoly oxide comprises oxynitride.

5. The split-gate memory cell of claim 1, wherein said interpoly oxide is formed at a temperature between about 800to 1000° C.

6. The split-gate memory cell of claim 1, wherein said control gate has a thickness between about 1000 to 3000 Å.

* * * * *